US007212276B2

(12) United States Patent
Kasai (10) Patent No.: US 7,212,276 B2
(45) Date of Patent: May 1, 2007

(54) EXPOSURE APPARATUS

(75) Inventor: Ryo Kasai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 11/042,195

(22) Filed: Jan. 26, 2005

(65) Prior Publication Data
US 2005/0162633 A1 Jul. 28, 2005

(30) Foreign Application Priority Data
Jan. 28, 2004 (JP) ............................. 2004-020379

(51) Int. Cl.
*G03B 27/72* (2006.01)
(52) U.S. Cl. ............................. 355/69; 327/55; 327/59
(58) Field of Classification Search ................... 355/67, 355/69
See application file for complete search history.

(56) References Cited

U.S. PATENT DOCUMENTS 5,097,291 A * 3/1992 Suzuki ........................ 355/69

5,250,797 A   10/1993 Sano et al. ................. 250/205
5,646,954 A *  7/1997 Das et al. ..................... 372/55
6,219,367 B1*  4/2001 Atsumi ......................... 372/59
2005/0141903 A1*  6/2005 Kwon .......................... 399/24

FOREIGN PATENT DOCUMENTS

| JP | 04252013 | * | 9/1992 |
| JP | 5-62876 | | 3/1993 |
| JP | 8-167562 | | 6/1996 |

* cited by examiner

Primary Examiner—D. Rutledge
(74) Attorney, Agent, or Firm—Fitzpatrick, Cella, Harper & Scinto (57) ABSTRACT

An exposure apparatus including a pulse light source, an exposure unit which exposes a substrate to a pattern with light from the pulse light source, a determination unit which determines necessity of maintenance for the pulse light source based on a pulse rate of the pulse light source within a predetermined period of time, and a decision unit which decides a timing of the maintenance based on a determination result of the determination unit.

10 Claims, 10 Drawing Sheets

MAINTENANCE EXECUTIVE CONTROL TABLE

| MAINTENANCE ITEM | NUMBER OF OSCILLATION COMMAND PULSES(Kpls) | PRESET TIME(Minutes) | PRESET Duty(%) | MAINTENANCE STATE |
|---|---|---|---|---|
| ITEM A | 2500 | 60.0 | 10 | NORMAL |
| ITEM B | 10 | 30.0 | 5 | EXECUTING MAINTENANCE |
| ITEM C | 560 | 15.0 | 5 | MAINTENANCE REQUESTED |
| 601 | 602 | 603 | 604 | 605 |

EXPOSURE APPARATUS

FIELD OF THE INVENTION

The present invention relates to an exposure apparatus, which exposes a substrate, such as a wafer or glass plate, to a pattern.

BACKGROUND OF THE INVENTION

In recent years, in the semiconductor device technology, the device integration degree has been increasing and the device feature size has been shrinking more and more. In a lithography system used in a lithography process, a pulse laser, such as a KrF or an ArF excimer laser, is used as a light source device in a far ultraviolet region. A lithography system using an excimer laser includes an excimer laser and an exposure device. The excimer laser is connected to the exposure device through an interface cable such as an optical fiber. An exposure operation in the lithography system is as follows. A reticle is illuminated with a pulse laser beam output from the excimer laser in accordance with an exposure sequence controlled by a main controller provided to the exposure device. A circuit pattern formed on the reticle is projected onto a resist coated wafer through an image forming optical system. Thus, the resist on the wafer is exposed with the pattern to form a latent image.

As the excimer laser, generally, a gas mixture of three types of gases, i.e., a halogen gas, such as fluorine, an inert gas, such as krypton or argon, and a rare gas, such as helium or neon, is sealed in a laser chamber. In the excimer laser, when electrical discharge occurs in the chamber, the halogen gas and inert gas react with each other to oscillate a pulse laser beam as exposure light. When the pulse laser beam is repeatedly oscillated, the halogen gas is bonded with impurities generated in the chamber or attracted to the inner side of the chamber. Then, the concentration of the halogen gas decreases to decrease the pulse energy of the laser beam, and the constituent components of the laser light source are degraded.

In a lithography system that uses the excimer laser as the light source, when the pulse energy fluctuates, inconveniences, such as a decrease in control accuracy of the exposure dose on a photosensitive substrate, occur. To obtain a high resolution and good line width reproducibility, an exposure dose control method of controlling the pulse energy for each exposure light pulse is necessary. Japanese Patent Laid Open No. 5-62876 proposes an exposure dose control method as a method which overcomes this issue.

Figure 9:
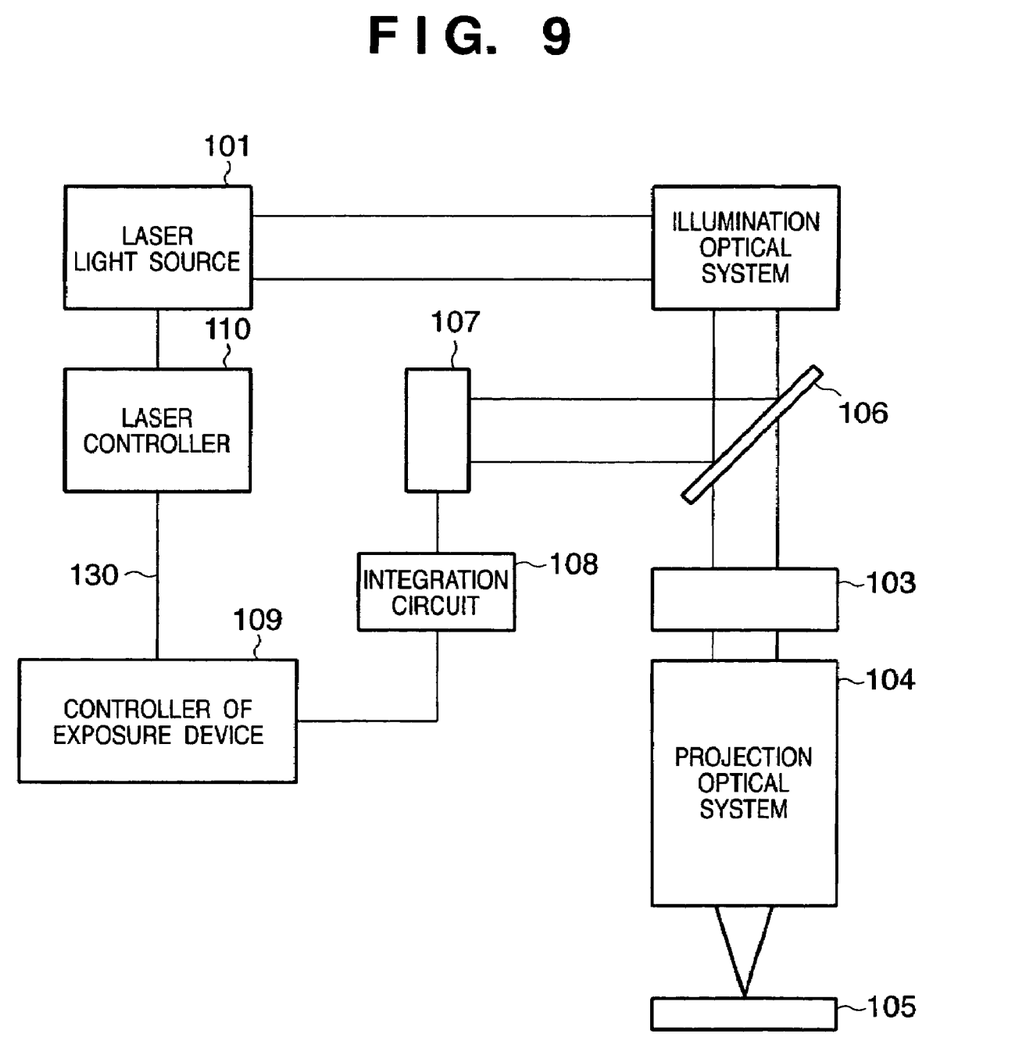
FIG. 9 is a block diagram showing the structure of an exposure apparatus disclosed in Japanese Patent Laid Open No. 5-62876.

FIG. 9 is a block diagram showing the structure of an exposure apparatus disclosed in Japanese Patent Laid Open No. 5-62876. Referring to FIG. 9, a gas such as KrF is sealed in a pulse laser light source 101, which outputs a laser beam. An illumination optical system 102 includes a beam shaping optical system, an optical integrator, a collimator, and a mirror (not shown). A reticle 103 has the circuit pattern of a semiconductor device to be printed (transferred), and is illuminated by the illumination optical system 102. The circuit pattern of the reticle 103 is reduced and projected onto a wafer 105 by a projection optical system (reduction projection lens) 104. A half mirror 106 is arranged in the optical path between the illumination optical system 102 and reticle 103. Part of the exposure light that illuminates the reticle 103 is extracted as it is reflected by the half mirror 106. An ultraviolet photosensor 107 is arranged on the optical path of the light reflected by the half mirror 106. The photosensor 107 generates an output corresponding to the intensity of the exposure light.

The output from the photosensor 107 is converted into an exposure energy per pulse by an integration circuit 108, which integrates each pulse emission of the pulse laser light source 101, and is provided to a controller 109, which calculates an integrated exposure dose, of an exposure device. The controller 109 outputs an appropriate application voltage value and a laser emission command signal to a laser controller 110 on the basis of the calculation result. The energy of the exposure light generated by the pulse laser light source 101 is controlled in accordance with the application voltage value of the laser controller 110. These operations are repeated to control the integrated exposure dose of the circuit pattern image of the reticle 103, which is to be printed on the wafer 105.

When the degradation of the light source, such as an excimer laser, exceeds an allowance, for example, the laser gas or constituent components must be exchanged. This maintenance is generally performed when the laser controller (light source controller) sends a maintenance request to the main controller of the exposure device in accordance with the number of emission pulses or use time. Upon reception of the maintenance request, the main controller can perform a process (e.g., an alarm to the operator) for the maintenance immediately after the exposure is ended if exposure operation is being performed, and immediately if a non exposure operation is being performed.

It is not preferable to limit the maintenance timing to a time point immediately after the maintenance request is made or immediately after the exposure operation is ended. For example, during a process that does not require laser beam emission or in adjustment of the lithography system, if the exposure device receives a maintenance request signal and a maintenance process for the laser light source is performed immediately in response to the signal, the resources may be wasted. If a timing for checking the maintenance request signal is constantly set to a time point immediately before the emission timing of the excimer laser, waste of the resources can be avoided. When, however, a maintenance request is generated, the wafer exposure process is always delayed by a time corresponding to the maintenance process time. This decreases the throughput.

SUMMARY OF THE INVENTION

The present invention has been made on the basis of the recognition of the above problems, and an exemplary object of the present invention to make appropriate the maintenance timing of the light source, e.g., reducing or eliminating execution of unnecessary maintenance.

One aspect of the present invention is directed to an exposure apparatus, and the apparatus comprises a pulse light source, an exposure unit which exposes a substrate to a pattern with light from the pulse light source, and a determination unit which determines necessity of maintenance for the pulse light source based on a pulse rate of the pulse light source within a predetermined period of time.

According to a preferred embodiment of the present invention, the determination unit can determine that maintenance is necessary, if the pulse rate is not less than a predetermined value.

According to a preferred embodiment of the present invention, the determination unit can calculate the pulse rate from a number of pulses, which is weighted in accordance with time in the predetermined period of time.

According to a preferred embodiment of the present invention, the determination unit can determine the need for maintenance based on a total number of pulses from the pulse light source, as well as the pulse rate.

According to a preferred embodiment of the present invention, the apparatus can further comprise a decision unit, which decides a timing of the maintenance based on a determination result of the determination unit.

According to a preferred embodiment of the present invention, the decision unit can set the timing of the maintenance to a time point after oscillation of the pulse light source is completed.

According to a preferred embodiment of the present invention, the decision unit can decide whether the maintenance is to be performed prior to oscillation of the pulse light source.

According to a preferred embodiment of the present invention, the decision unit can decide whether the maintenance is to be performed prior to execution of an exposure job.

According to a preferred embodiment of the present invention, the apparatus can further comprise a management unit, which manages a process concerning the maintenance as a job queue together with the exposure job.

According to a preferred embodiment of the present invention, the pulse light source can comprise an excimer laser light source.

Another aspect of the present invention is directed to a method of maintaining a pulse light source, and the method can be applied to an exposure apparatus that exposes a substrate to a pattern with light from the pulse light source. The method comprises steps of determining necessity of maintenance for the pulse light source based on a pulse rate of the pulse light source within a predetermined period of time, and deciding a timing of the maintenance based on a determination result in the determining step.

According to the present invention, the maintenance timing of the light source device can be optimized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described with reference to the accompanying drawings.

First Embodiment

Figure 1:
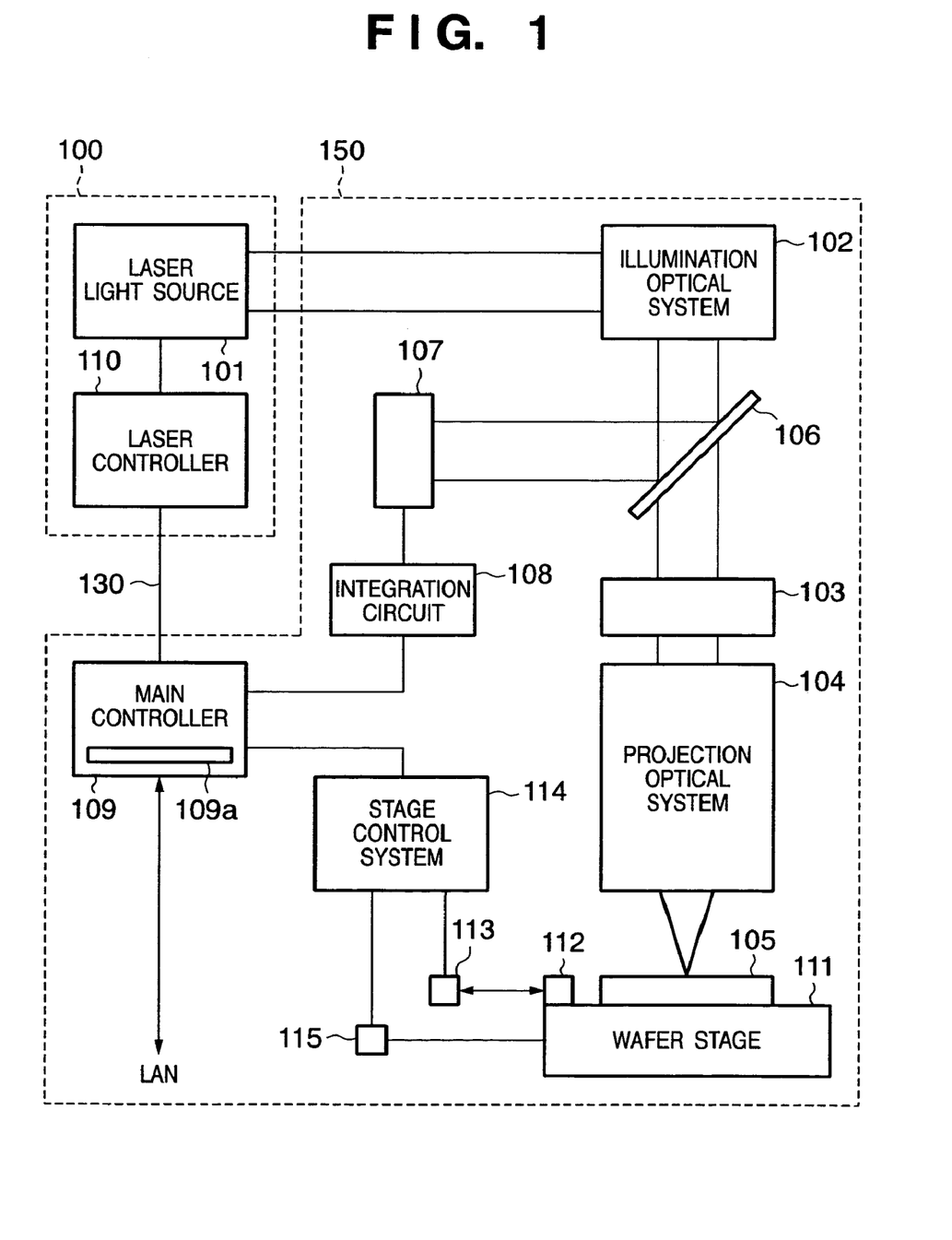
FIG. 1 is a block diagram showing the schematic structure of a lithography system according to a preferred embodiment of the present invention.

FIG. 1 is a block diagram showing the schematic structure of a lithography system according to a preferred embodiment of the present invention. The lithography system can include an exposure device 150 and a light source device 100. For example, the exposure device 150 includes an illumination optical system 102, a projection optical system 104, a wafer stage 111, a main controller 109, and the like. For example, the light source device 100 includes a light source 101, such as a laser light source or a pulse laser light source, and a laser controller (light source controller).

A gas, such as KrF, can be sealed in the laser light source 101 to emit light having a wavelength of 248 nm in a far ultraviolet region. For example, the laser light source 101 can be provided with a front mirror which forms a resonator, a band narrowing module formed of a diffraction grating, a prism, or the like, to narrow the band of the exposure wavelength, a monitor module formed of a spectroscope or a detector, to monitor the stability, spectrum, and width of the wavelength, and a shutter. The gas exchange operation of the laser light source 101, wavelength stabilization, discharge application voltage, and the like, are controlled by a laser controller 110 (light source controller). In this lithography system, single control by only the laser controller 110 is not performed. The laser controller 110 operates in accordance with an instruction from the main controller 109 of the exposure device connected through an interface cable 130.

For example, the illumination optical system 102 can include a beam shaping optical system, an optical integrator, a collimator, and a mirror (not shown). These members are formed of members that transmit or reflect light in the far ultraviolet region efficiently. The beam shaping optical system shapes a laser beam to have a desired spot shape. The optical integrator makes uniform the luminous intensity distribution characteristics of a beam. The circuit pattern of a semiconductor device to be printed is formed on a reticle (master) 103, which can be aligned by a reticle stage (not shown). The reticle 103 is illuminated by the illumination optical system 102. The circuit pattern of the reticle 103 is reduced and projected onto a wafer 105 by a projection optical system (reduction projection lens) 104.

The wafer stage 111, which aligns the wafer 105, can move in a two-dimensional direction. A moving mirror 112 is fixed to the wafer stage 111. A laser interferometer 113 detects the position of the wafer stage 111 by using the moving mirror 112.

A stage control system 114 under the control of the main controller 109 of the exposure device controls a driver 115, such as a motor, on the basis of the position information of the wafer stage 111 provided by the laser interferometer 113, to move the wafer stage 111 to a predetermined position.

A half mirror 106 is arranged in the optical path between the illumination optical system 102 and reticle 103. Part of the exposure light that illuminates the reticle 103 is extracted as it is reflected by the half mirror 106. An ultraviolet photosensor 107 is arranged on the optical path of the light reflected by the half mirror 106. The photosensor 107 generates an output corresponding to the intensity of the exposure light. The output from the photosensor 107 is converted into an exposure energy per pulse by an integration circuit 108, which integrates each pulse emission of the laser light source 101, and is provided to the main controller 109, which calculates an integrated exposure dose, of the exposure device.

The main controller 109 outputs an application voltage value and a laser emission command signal to the laser controller 110 on the basis of the result calculated in accordance with a function V=f(E), which indicates the relationship between an application voltage V and pulse energy E. The energy of the exposure light generated by the pulse laser light source 101 is controlled in accordance with the application voltage value of the laser output controller 110. These operations are repeated to control the integrated exposure dose of the circuit pattern image of the reticle 103, which is to be printed on the wafer 105.

Figure 2:
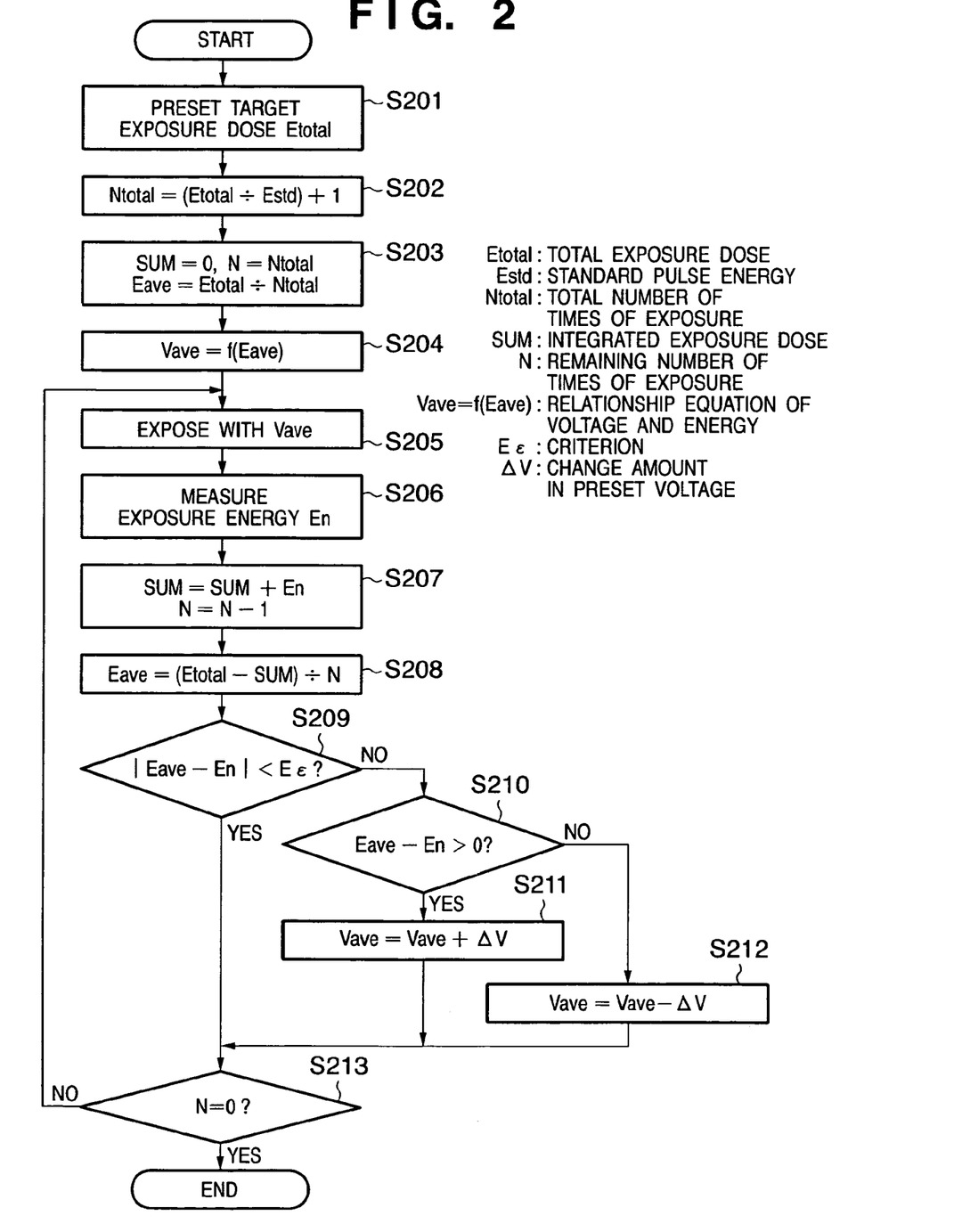
FIG. 2 is a flowchart showing in detail an exposure control method in the lithography system shown in FIG. 1.

FIG. 2 is a flowchart showing in detail an exposure control method in the lithography system shown in FIG. 1. In step S201, a total exposure dose Etotal as a target exposure dose is set. In step S202, a total number Ntotal of times of exposure (number of times of pulse emission) is set on the basis of the total exposure dose Etotal and a preset standard pulse energy Estd. In step S203, an integrated exposure dose SUM, a remaining number N of times of exposure, and an average pulse energy Eave are set. Note that the integrated exposure dose SUM is 0, that the average pulse energy Eave is a value obtained by Etotal÷Ntotal, and that the remaining number N of times of exposure is the total number Ntotal of times of exposure.

In step S204, the preset voltage V for initial exposure is calculated in accordance with the function V=f(E), which indicates the relationship between the voltage and energy. This function can be decided by measuring the pulse energy E with respect to the application voltage V.

In step S205, exposure is performed with a preset voltage Vave. In step S206, an actual exposure dose En is measured. In step S207, the measured exposure dose En is added to the present integrated exposure dose SUM to obtain a new integrated exposure dose SUM, and the remaining number N of times of exposure is decremented. In step S208, the integrated exposure dose SUM is subtracted from the total exposure dose Etotal, i.e., the sum of the remaining exposure doses is obtained, and the sum is divided by the remaining number N of times of exposure, thus obtaining a value Eave. Eave signifies the average energy per pulse of remaining exposure.

In step S209, the average energy Eave and the exposure energy En of one exposure pulse are compared. If the absolute value of the difference is smaller than a criterion E$\epsilon$, the flow advances to step S213; if NO, the flow advances to step S210. In step S210, whether Eave−En is larger or smaller than 0 is checked. If Eave−En>0, in step S211, a preset change amount $\Delta V$ is added to the set voltage Vave to obtain a new Vave. If Eave−En<0, in step S212, the change amount $\Delta V$ is subtracted from the set voltage Vave to obtain a new Vave, and the flow advances to step S213. In step S213, whether or not the remaining number N of times of exposure is zero is checked. If NO, the flow returns to step S205; if YES, the process is ended.

In this manner, when the pulse energy that decreases along with a decrease in gas concentration of the laser light source 101 is detected and is fed back to the discharge application voltage to gradually increase the discharge application voltage, the pulse energy can be held at a constant value.

Figure 3:
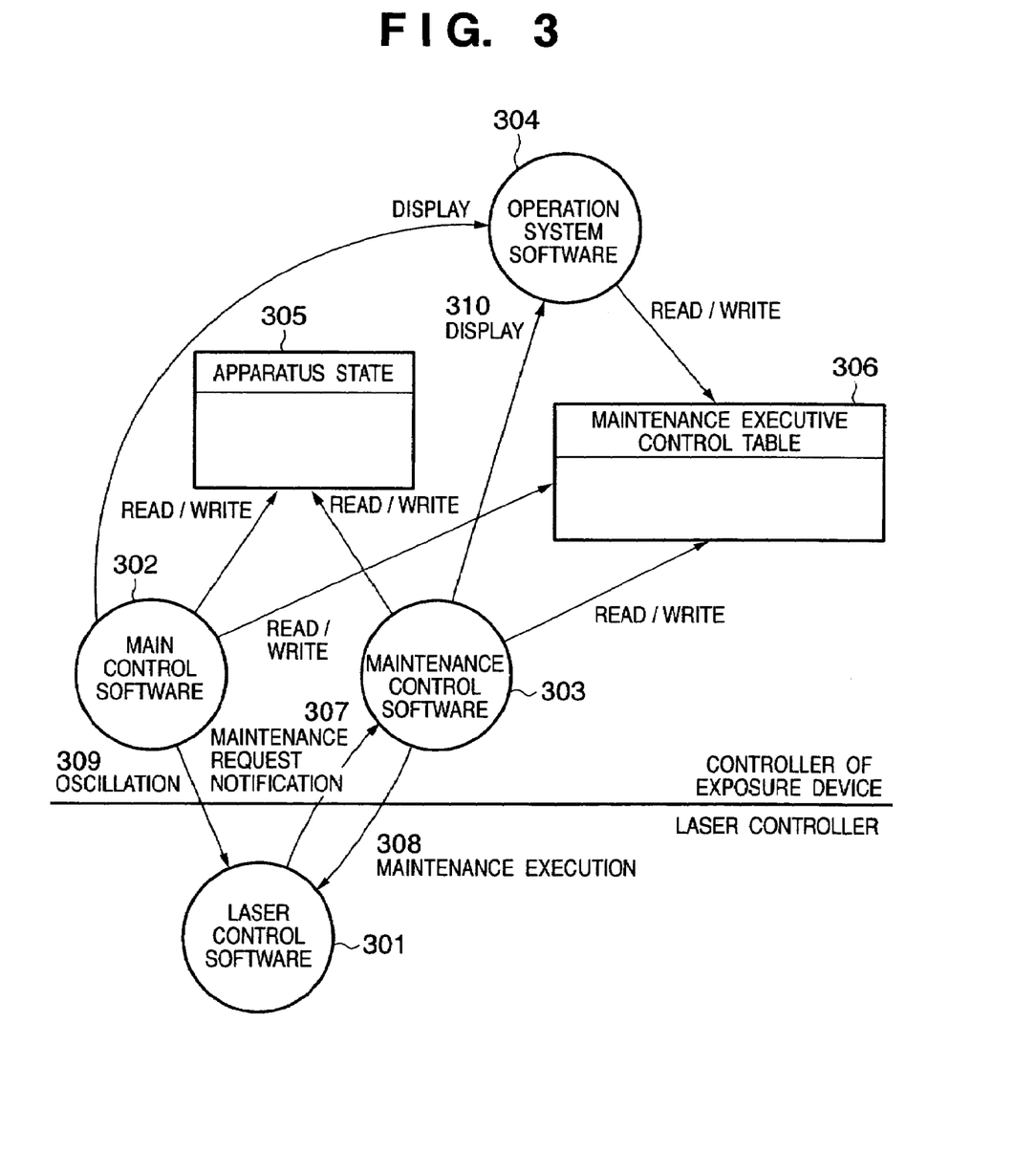
FIG. 3 is a view showing control software installed in a main controller 109 and control software installed in a laser controller 110, respectively, of an exposure device 150 shown in FIG. 1, and the relationship between the two software.

FIG. 3 is a view showing control software built in the main controller 109 and control software built in the laser controller 110, respectively, of the exposure device 150 shown in FIG. 1, and the relationship between the two software. Information indicating the gas exchange time of the laser light source 101 and deterioration of the constituent components is usually obtained by counting the number of laser emission pulses and use time with laser control software 301 installed in the laser controller 110. Maintenance control software 303 installed in the main controller 109 of the exposure device 150 can monitor the number of laser emission pulses and use time counted by the laser control software 301.

When the count exceeds a preset upper limit value, the control software 301 of the laser controller 110 sends a maintenance request notification 307 to the maintenance control software 303 in the main controller 109 of the exposure device 150. If the maintenance request notification 307 requests exchange of the constituent components of the laser light source 101, the maintenance control software 303 sends a display request 310 to operation system software 304, to display a predetermined message on the console screen to notify the operator. The operator can exchange the constituent components on the basis of the display content.

Main control software 302 supervises laser light source control other than the maintenance process. The exposure device 150 holds information indicating the current state of the lithography system as apparatus state information 305 in a storage (e.g., nonvolatile memory) 109a. The apparatus state information 305 can include, e.g., information that means "oscillating laser" and "idling". Also, time, the number of oscillation pulses (number of pulses of exposure light to be generated) commanded to the laser control software 301 (laser controller 110), and the maintenance state for each maintenance item are held as a maintenance executive control table 306 in the storage 109a.

Figure 4:
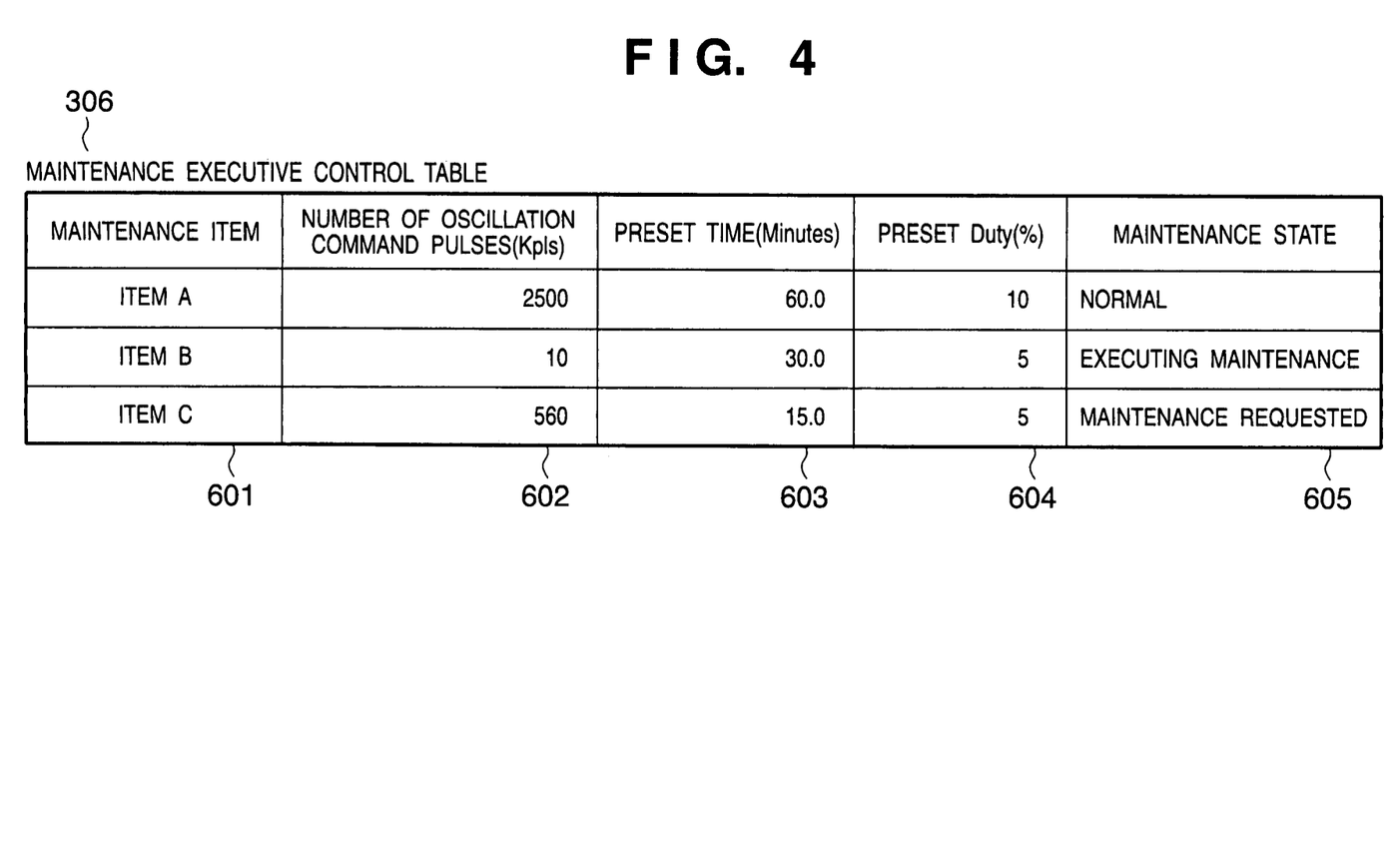
FIG. 4 is a table schematically showing an example of a maintenance executive control table 306.

FIG. 4 is a table schematically showing an example of the maintenance executive control table 306. Maintenance item 601 indicates a process or an operation for correcting a change over time in the characteristics of the laser light source, and includes, e.g., gas exchange, absolute wavelength correction, energy correction, and adjusted oscillation. The number 602 of oscillation command pulses is the integrated value of the number of oscillation pulses instructed from the main control software 302 built in the main controller 109 of the exposure device 150 to the laser control software 301 built in the laser controller 109. The number 602 of oscillation command pulses is updated by the main control software 302 at each oscillation. When a maintenance process is performed, the number 602 of oscillation command pulses is cleared to zero by the maintenance control software 303. Preset Duty (described as "Set Duty" as well in this specification) 604 indicates the proportion of laser oscillation time in preset time 603. The operator can arbitrarily set the preset Duty 604 through the operation system software 304 for each maintenance item. A maintenance state 605 indicates the current state of a given maintenance item 601, and can be "a normal state", "executing maintenance", or "maintenance requested".

Figure 6:
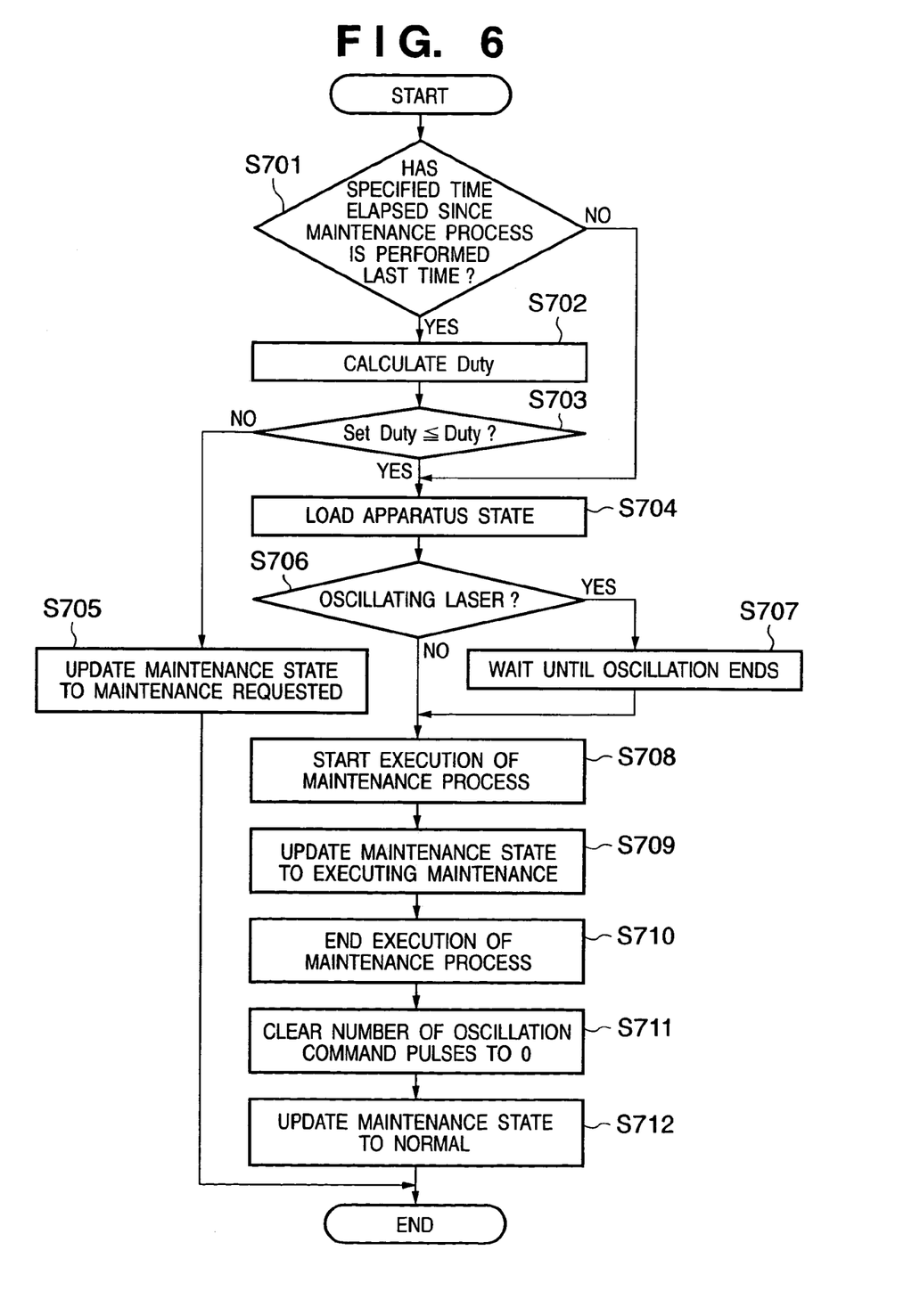
FIG. 6 is a flowchart showing the flow of a process that maintenance control software 303 executes upon reception of a maintenance request notification 307 from laser control software 301.

FIG. 6 is a flowchart showing the flow of a process that the maintenance control software 303 executes upon reception of the maintenance request notification 307 from the laser control software 301. In step S701, it is checked whether the maintenance request is made because a specified number of pulses has been oscillated or a specified time has elapsed. This determination can be performed on the basis of the "number of oscillation command pulses" controlled by the maintenance executive control table 306, or by acquiring information on the reason of the maintenance request from the laser control software 301. If the maintenance request is made because the specified number of pulses has been oscillated, this means that the laser light source 101 is oscillating. In this case, the maintenance process must be performed, and accordingly, the flow advances to step S704.

If the maintenance request is made because the specified time has elapsed, in step S702, Duty is calculated to check whether or not the maintenance process should be executed at once. Duty indicates the proportion of the number of actual oscillation pulses to the maximum number of oscillation pulses that can be oscillated within a certain time. The Duty value can be calculated in accordance with the following equation (1):

Duty=(total number of weighted oscillation pulses)÷(maximum number of oscillation pulses)×100 [%]  (1)

The maximum number of oscillation pulses in equation (1) indicates the maximum number of oscillation pulses that can be oscillated within the preset time 603, and can be calculated in accordance with the following equation (2):

(maximum number of oscillation pulses)=(maximum oscillation frequency of laser)×(preset time 603)×60 [pulse]  (2)

The total number of weighted oscillation pulses in equation (1) is the sum of values each obtained by multiplying the number of pulses (number of actual oscillation pulses) actually oscillated in a predetermined time segment (i.e., a time segment of t−Δt to t+ΔT) within the preset time 603 by the value of the function f(t) having as a variable typical time t in the predetermined time segment. The total number of weighted oscillation pulses can be calculated in accordance with the following equation (3):

(total number of weighted oscillation pulses)=Σ{(number of actual oscillation pulses)×f(t)}  (3)

where t is 0.0 to the preset time 603 and f(t) is a weighting function.

Figure 5A:
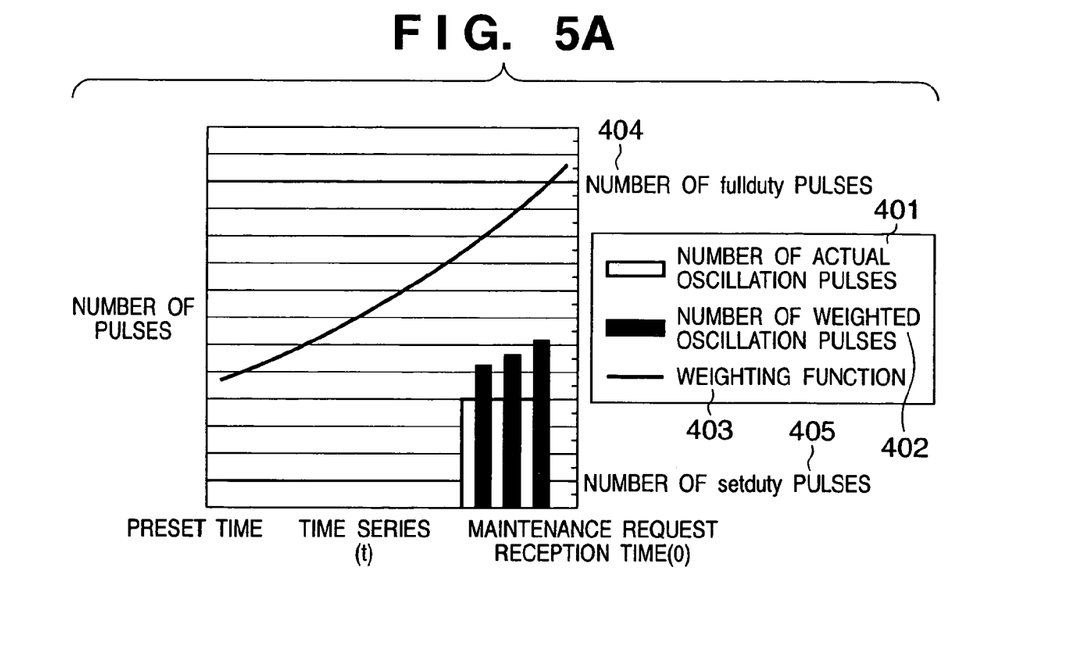
FIGS. 5A and 5B are graphs each showing the relationship among the number of actual oscillation pulses within a preset time, the number of weighted oscillation pulses, and Duty.
Figure 5B:
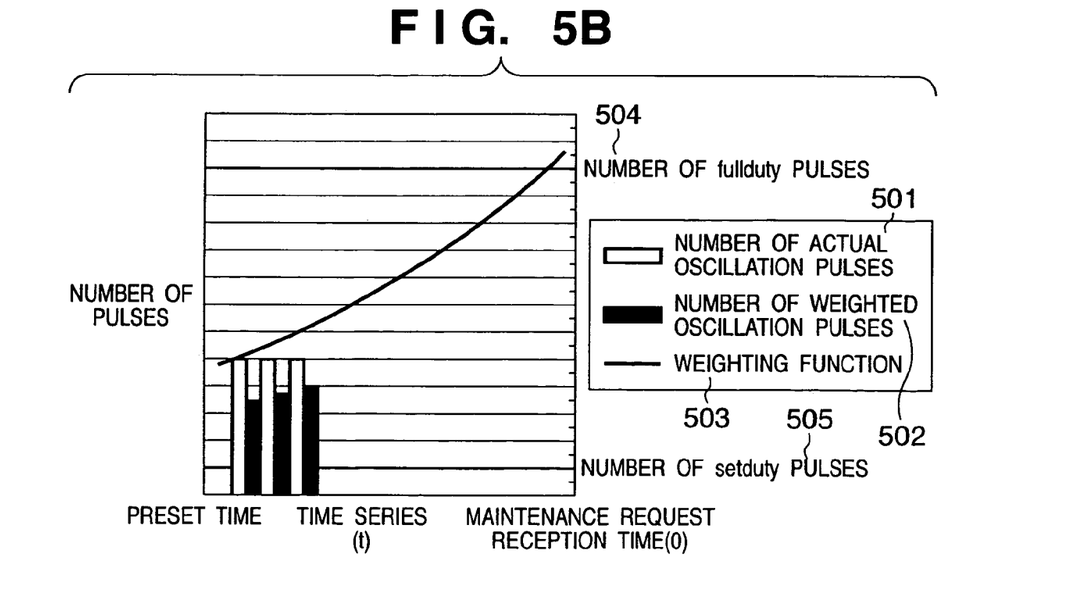

FIGS. 5A and 5B are graphs each showing the relationship among the number of actual oscillation pulses within the preset time 603, the number of weighted oscillation pulses, and Duty. In FIGS. 5A and 5B, the axis of abscissa represents time, and the axis of ordinate represents the number of oscillation pulses. Each of numbers 404 and 504 of full-duty pulses indicates the maximum number of oscillation pulses in a certain time segment. Numbers 405 and 505 of set-duty pulses can be calculated in accordance with the following equation (4):

(number of setduty pulses)=(number of full-duty pulses)×(Preset Duty 604)÷100 [pulse]  (4)

The numbers 402 and 502 of weighted oscillation pulses are respectively calculated by multiplying the numbers 401 and 501 of actual oscillation pulses by weighting functions (f(t)) 403 and 503 of Exponential curves with which, e.g., the closer to a maintenance request reception time, the larger the weighting. The sum corresponds to equation (3). For example, the weighting functions 403 and 503 can be set by the operator by selecting from a plurality of polynomial functions or an arbitrary setting on the console screen.

FIG. 5A shows a case wherein many laser oscillations are made in a time band close to the maintenance request reception time in the preset time. Due to the weighting function, the total number of weighted oscillation pulses becomes larger than the total number of actual oscillation pulses and larger than the value of "(numbers 405, 505 of set-duty pulses)×(preset time 603)". In this case, in step S703, the calculated Duty is larger than the preset Duty (Set Duty) 604. Accordingly, it is determined that the maintenance should be executed immediately, and the flow advances to the process of step S704.

In step S704, the maintenance control software 303 loads the apparatus state information 305. In step 706, whether the laser is an "oscillating laser" or not is checked. If YES, in step S707, oscillation end is awaited. In step S708, execution of a desired maintenance process is started. In step S709, the maintenance state 605 is updated to "executing maintenance". In step S710, execution of the maintenance process is ended. In step S711, the number 602 of oscillation command pulses is updated to zero. In step S712, the maintenance state 605 is updated to "normal", and the process is ended.

FIG. 5B shows a case wherein many laser oscillations are made in a time zone close to (maintenance request reception time−preset time) in the preset time 603. Due to the weighting function, the total number of weighted oscillation pulses becomes smaller than the total number of actual oscillation pulses and smaller than the value of "(numbers 405, 505 of set-duty pulses)×(preset time 603)". In this case, in step S703, the calculated Duty is smaller than the preset Duty (Set Duty) 604. Accordingly, it is determined that the maintenance need not be executed immediately, and the flow advances to the process of step S705. In step S705, the maintenance state 605 is updated to "maintenance requested", and the process is ended.

As described above, the maintenance timing can be decided on the basis of a change in time (e.g., FIGS. 5A and 5B) of the use status of the laser light source 101 within a predetermined time before reception of a maintenance request.

Figure 7:
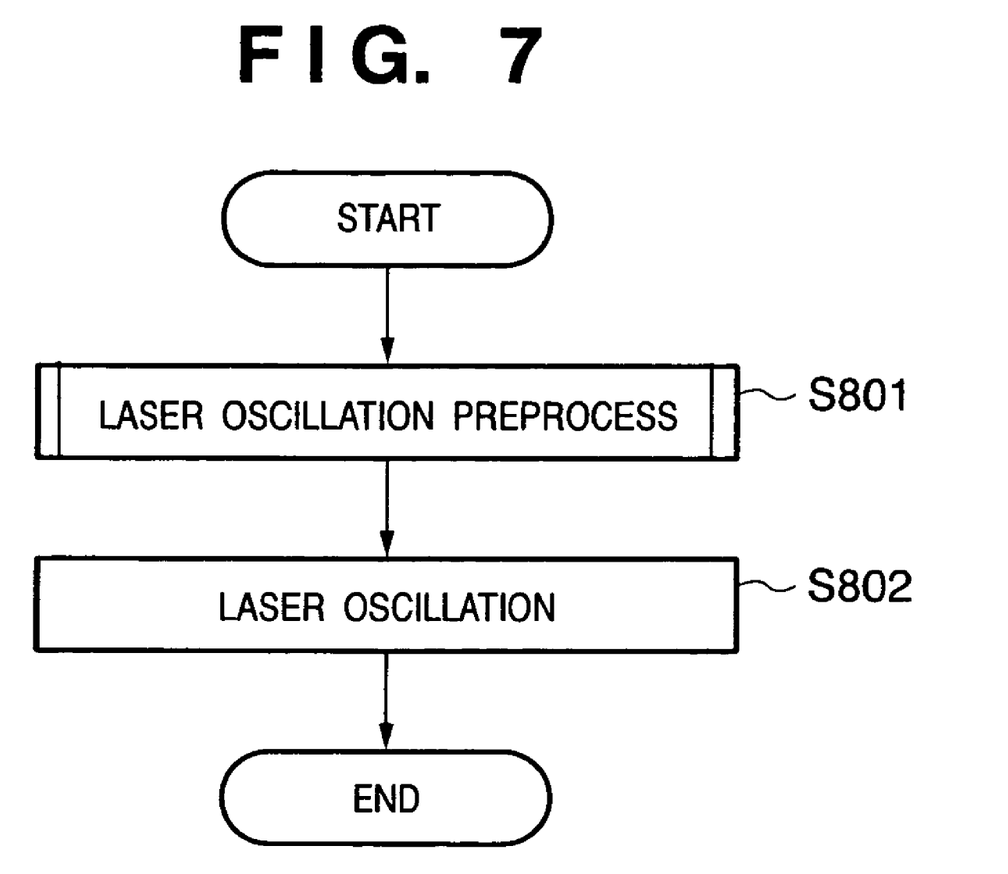
FIG. 7 is a flowchart showing the flow of a laser oscillation process and a maintenance process performed before laser oscillation.

FIG. 7 is a flowchart showing the flow of a laser oscillation process and a maintenance process performed before laser oscillation. During the laser oscillation process, in the exposure device 150, the main control software 302 requests the maintenance control software 303 to execute an oscillation preprocess. In step S801, the maintenance control software 303 executes a laser oscillation preprocess. When the laser oscillation preprocess is ended, the main control software 302 executes the laser oscillation process in step S802.

Figure 8:
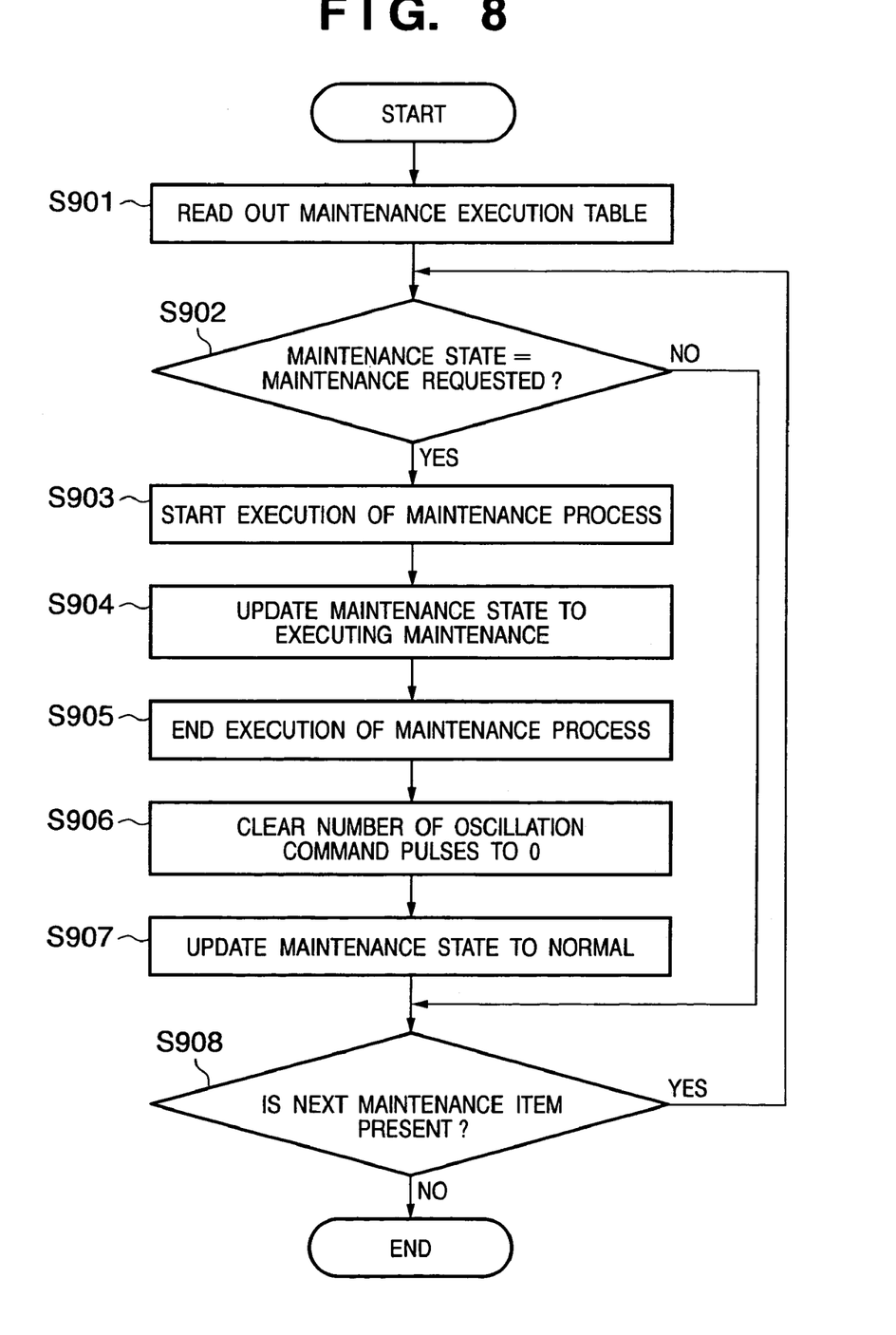
FIG. 8 is a flowchart showing step S801 (laser oscillation preprocess) of FIG. 7 in detail.

FIG. 8 is a flowchart showing step S801 (laser oscillation preprocess) of FIG. 7 in detail. In step S901, the maintenance control software 303 reads out the maintenance executive control table 306. In steps S902 to S908, the maintenance control software 303 processes respective maintenance items registered on the maintenance executive control table 306.

More specifically, in step S902, the maintenance control software 303 checks whether or not the maintenance state 605 corresponding to a given maintenance item 601 is a "maintenance requested" state. If the maintenance state 605 is "normal" or "executing maintenance", the flow advances to step S908. If the maintenance state 605 is "maintenance requested", in step S903, execution of the maintenance process is started (for example, a message prompting execution of the maintenance is displayed on the console and a necessary process is executed). In step S904, the maintenance state 605 is updated to "executing maintenance".

When execution of the maintenance process is ended in step S905, the number 602 of oscillation command pulses is updated to zero in step S906. In step S907, the maintenance state 605 is updated to the "normal" state. The flow then advances to step S908. In step S908, whether or not the next maintenance item (non processed maintenance item) is present is checked. If YES, the flow returns to step S902; if NO, the series of laser oscillation preprocess are ended.

Second Embodiment

In the following description, the difference between the first and second embodiments of the present invention will be described. Except for the items to be described herein, the second embodiment can be the same as the first embodiment.

Figure 10:
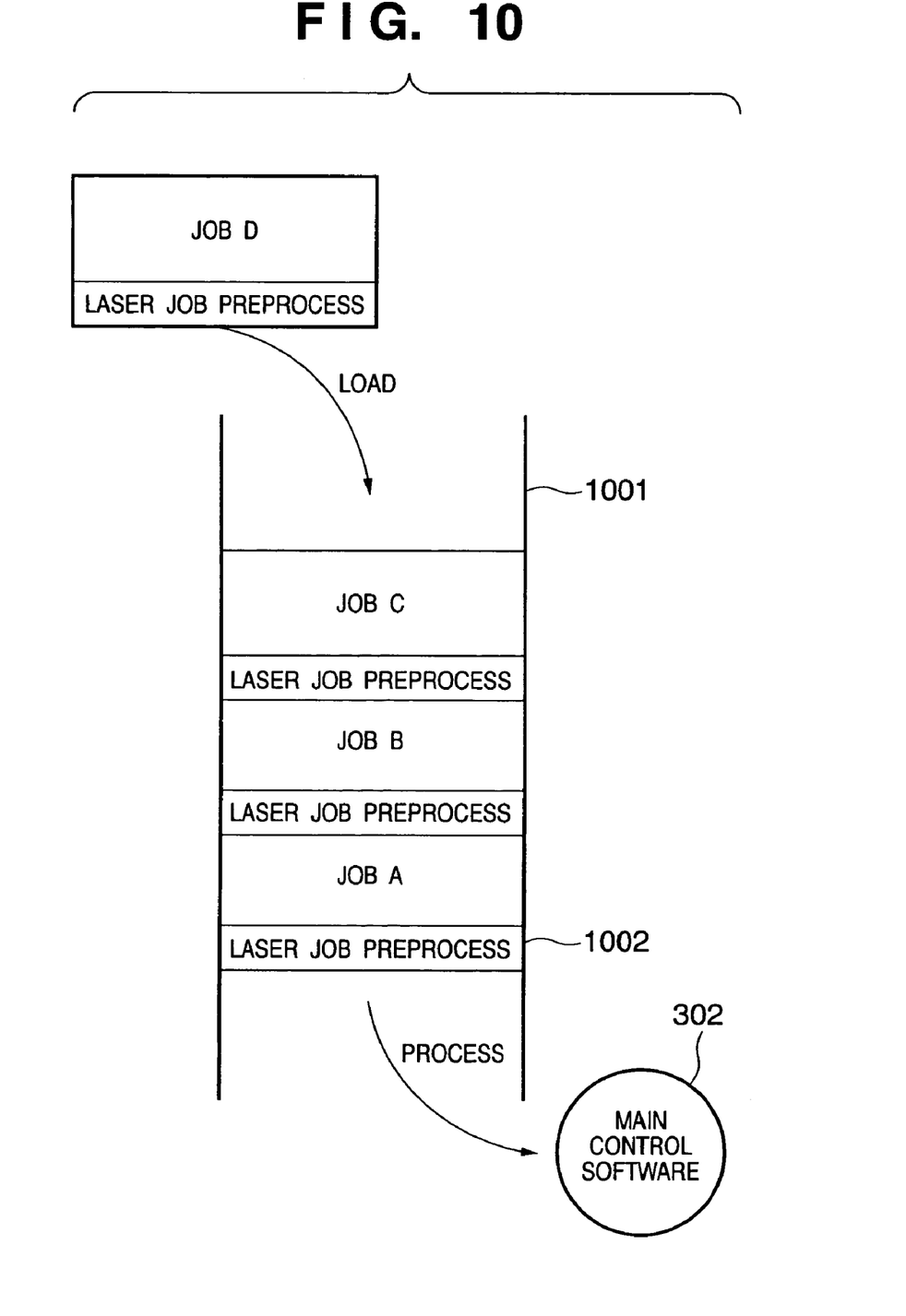
FIG. 10 is a view showing a maintenance process for a laser light source 101 when a plurality of jobs are to be processed at once.

FIG. 10 is a view showing the maintenance process of a laser light source 101 when a plurality of jobs are to be processed at once. Japanese Patent Laid Open No. 8-167562 discloses a method of storing a file including job information in a job queue 1001 in advance, when a plurality of jobs are to be processed, and continuously processing them, as shown in FIG. 10. According to this embodiment, in the job queue 1001, a maintenance process 1002 for the laser light source 101 is placed before exposure jobs A, B, C, and D, to maintain the laser light source 101 at an optimal state during execution of the exposure jobs A, B, C, and D. Therefore, errors such as an exposure dose control error can be decreased.

Alternatively, the job file can include flag information indicating whether or not the maintenance process for the laser light source 101 is to be executed, and whether or not the main control software 302 is to execute the maintenance process before the job can be decided. A job managing portion for managing the jobs can be typically formed in a software manner, and can be installed in the main control software 302.

In the first embodiment, flag information indicting whether or not a laser oscillation preprocess is to be executed may be managed, and the maintenance process is to be performed at which timing, i.e., before the start of each exposure job or before the start of each laser oscillation, can be selected. For example, in an exposure job concerning a rough layer, an emphasis can be put on the throughput. As shown in FIG. 10, the process flow shown in FIG. 8 is performed before the start of the exposure job. In an exposure jog for a critical relayer, an emphasis can be put on the exposure accuracy. The process flow shown in FIG. 8 can be performed for each laser oscillation, as in the first embodiment. On which one an emphasis is to be put, the quality of the laser beam or the throughput, can be selected for each job.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-020379 filed on Jan. 28, 2004, the entire contents of which are hereby incorporated by reference herein.

What is claimed is:

1. An exposure apparatus comprising:
a pulse light source;
an exposure unit which exposes a substrate to a pattern with light from said pulse light source;
a determination unit which determines necessity of maintenance for said pulse light source based on a pulse rate of said pulse light source within a predetermined period of time; and
a decision unit which decides a timing of the maintenance based on a determination result of said determination unit.

2. An apparatus according to claim 1, wherein said determination unit determines that the maintenance is necessary if the pulse rate is not less than a predetermined value.

3. An apparatus according to claim 1, wherein said determination unit calculates the pulse rate from a number of a pulse which is weighted in accordance with time in the predetermined period of time.

4. An apparatus according to claim 1, wherein said determination unit determines necessity of the maintenance based on a total number of pulses from said pulse light source, as well as the pulse rate.

5. An apparatus according to claim 1, wherein said decision unit sets the timing of the maintenance to a time point after oscillation of said pulse light source is completed.

6. An apparatus according to claim 1, wherein said decision unit decides whether the maintenance is to be performed prior to oscillation of said pulse light source.

7. An apparatus according to claim 1, wherein said decision unit decides whether the maintenance is to be performed prior to execution of an exposure job.

8. An apparatus according to claim 7, further comprising a management unit which manages a process concerning the maintenance as a job queue together with the exposure job.

9. An apparatus according to claim 1, wherein said pulse light source comprises an excimer laser light source.

10. A method of maintaining a pulse light source of an exposure apparatus that exposes a substrate to a pattern with light from the pulse light source, said method comprising steps of:
determining necessity of maintenance for the pulse light source based on a pulse rate of the pulse light source within a predetermined period of time; and
deciding a timing of the maintenance based on a determination result in said determining displaying a timing of the maintenance based on a decision in said deciding step to notify an operator.

* * * * *

UNITED STATES PATENT AND TRADEMARK OFFICE
CERTIFICATE OF CORRECTION

PATENT NO. : 7,212,276 B2
APPLICATION NO. : 11/042195
DATED : May 1, 2007
INVENTOR(S) : Hiroyuki Sekiguchi It is certified that error appears in the above-identified patent and that said Letters Patent is hereby corrected as shown below:

ON THE TITLE PAGE:
In item "(56) References Cited," under "FOREIGN PATENT DOCUMENTS," the first-listed document, "JP   04252013   *   9/1992" should read
-- JP   4-252013   *   9/1992 --.

COLUMN 7:
Lines 66-67, "(number of setduty pulses)=(number of full-duty pulses)x(Preset Duty 604)÷100 [pulse]"
should read -- (number of set-duty pulses)=(number of full-duty pulses)x(Preset Duty 604)÷100 [pulse]. --

COLUMN 9:
Line 19, "preprocess" should read -- preprocesses --.
Line 48, "indicting" should read -- indicating --.
Line 57, "jog" should read -- job --.
Line 60, "On" should read -- Depending on --.

COLUMN 10:
Line 4, "thereof" should read -- hereof --.
Line 56, "and" should be deleted.
Line 59, "determining displaying a timing" should read -- determining step; and -- and the right margin should be closed up.
Line 60, a new paragraph should be starged and -- displaying a timing -- should be inserted before "of".

Signed and Sealed this

Twenty-fifth Day of December, 2007

JON W. DUDAS
*Director of the United States Patent and Trademark Office*